(12) United States Patent
Chang et al.

(10) Patent No.: US 7,915,674 B2
(45) Date of Patent: Mar. 29, 2011

(54) LATERAL DIFFUSED METAL OXIDE SEMICONDUCTOR DEVICE

(75) Inventors: Chyh-Yih Chang, Hsinchu (TW); Hsing-Hua Sun, Hsinchu (TW); Tsuan-Lun Lung, Hsinchu (TW); Chen-Ming Chiu, Hsinchu (TW)

(73) Assignee: Fitipower Integrated Technology, Inc., Miaoli County (TW)

( * ) Notice: Subject to any disclaimer, the term of this patent is extended or adjusted under 35 U.S.C. 154(b) by 309 days.

(21) Appl. No.: 12/133,388

(22) Filed: Jun. 5, 2008

(65) Prior Publication Data

US 2009/0096022 A1  Apr. 16, 2009

(30) Foreign Application Priority Data

Oct. 15, 2007 (CN) .......................... 2007 1 0164003

(51) Int. Cl.
*H01L 29/66* (2006.01)

(52) U.S. Cl. .................. 257/335; 257/E29.256

(58) Field of Classification Search .................. 257/335, 257/336, 337, 339, 343, E29.256, E29.261, 257/E21.417
See application file for complete search history.

(56) References Cited

U.S. PATENT DOCUMENTS

| 5,517,046 | A  | * | 5/1996 | Hsing et al. ................... 257/336 |
| 7,476,935 | B2 | * | 1/2009 | Kumagai et al. ............... 257/343 |
| 7,489,007 | B2 | * | 2/2009 | Williams et al. ............... 257/335 |
| 2002/0005550 | A1 | | 1/2002 | Takahashi et al. |
| 2005/0285198 | A1 | | 12/2005 | Chang et al. |
| 2008/0246086 | A1 | * | 10/2008 | Korec et al. ................... 257/343 |

OTHER PUBLICATIONS

Hossain et al., Field-plate Effects on the Breakdown Voltage of an Integrated High-voltage LDMOS Transistor, Proceedings of 2004 International Symposium on Power Semiconductor Devices & ICs, May 2004, p. 237-240, p. 19, IEEE, Kitakyushu, Japan.

* cited by examiner

*Primary Examiner* — Evan Pert
*Assistant Examiner* — Eduardo A Rodela
(74) *Attorney, Agent, or Firm* — Frank R. Nirajan

(57) ABSTRACT

An exemplary lateral diffused metal oxide semiconductor device includes a first-type substrate, a gate oxide film disposed on the first-type substrate, a poly gate disposed on the gate oxide film, a first second-type slightly doped region formed in the first-type substrate and acting as a well, a first first-type highly doped region formed in the well and acting as a body, a first second-type highly doped region formed in the body and acting as a source, a second second-type highly doped region formed in the well and acting as a drain, a second first-type highly doped region formed in the body, and a first first-type doped region formed in the body and is beneath the source.

17 Claims, 5 Drawing Sheets

LATERAL DIFFUSED METAL OXIDE SEMICONDUCTOR DEVICE

BACKGROUND

1. Field of the Invention

The present invention relates to metal oxide semiconductor (MOS), and particularly to a lateral diffused metal oxide semiconductor (LDMOS) device.

2. Description of Related Art

In the evolution of complementary metal oxide semiconductor (CMOS), lateral diffused MOS (LDMOS) plays a typical role in high voltage applications, for example, power supplies, power managements, telecommunications, automotive electronics, and industrial controls. An LDMOS device typically features a drain region that is lateral-diffused to the region below the poly gate. With the lateral diffused drain region, the electrical field across a gate oxide film is reduced when compared to the conventional MOS device. Thus, higher operation voltage of the LDMOS device is achieved. Detailed structure and characteristics of a typical LDMOS is introduced by HOSSAIN Zia et al., "Field-plate Effects on the Breakdown Voltage of an Integrated High-voltage LDMOS Transistor," IEEE Proceedings of 2004 International Symposium on Power Semiconductor Devices & ICs, pp. 237-240, Kitakyushu, Japan, May 2004.

However, the electrostatic discharge (ESD) robustness of the LDMOS device is not as good as the conventional MOS devices. As a result, it is difficult for conventional LDMOS devices to meet the conventional ESD industrial standard, human body model 2 kV, and machine model 200V.

Therefore, an improved LDMOS device is needed to address the aforementioned deficiency and inadequacies.

SUMMARY

A lateral diffused metal oxide semiconductor device includes a first-type substrate, a gate oxide film disposed on the first-type substrate, a poly gate disposed on the gate oxide film, a first second-type slightly doped region formed in the first-type substrate and acting as a well, a first first-type highly doped region formed in the well and acting as a body, a first second-type highly doped region formed in the body and acting as a source, a second second-type highly doped region formed in the well and acting as a drain, a second first-type highly doped region formed in the body, and a first first-type doped region formed in the body and is beneath the source. The source and the drain are disposed at two sides of the poly gate. The second first-type highly doped region is adjacent to the source. Parts of the body and the well are directly beneath the poly gate to isolate the source from the drain.

Other advantages and novel features of the present invention will become more apparent from the following detailed description of preferred embodiment when taken in conjunction with the accompanying drawings.

DETAILED DESCRIPTION OF THE EMBODIMENTS

References will now be made to the drawings to describe exemplary embodiments of the present lateral diffused metal oxide semiconductor (LDMOS) device.

Figure 1:
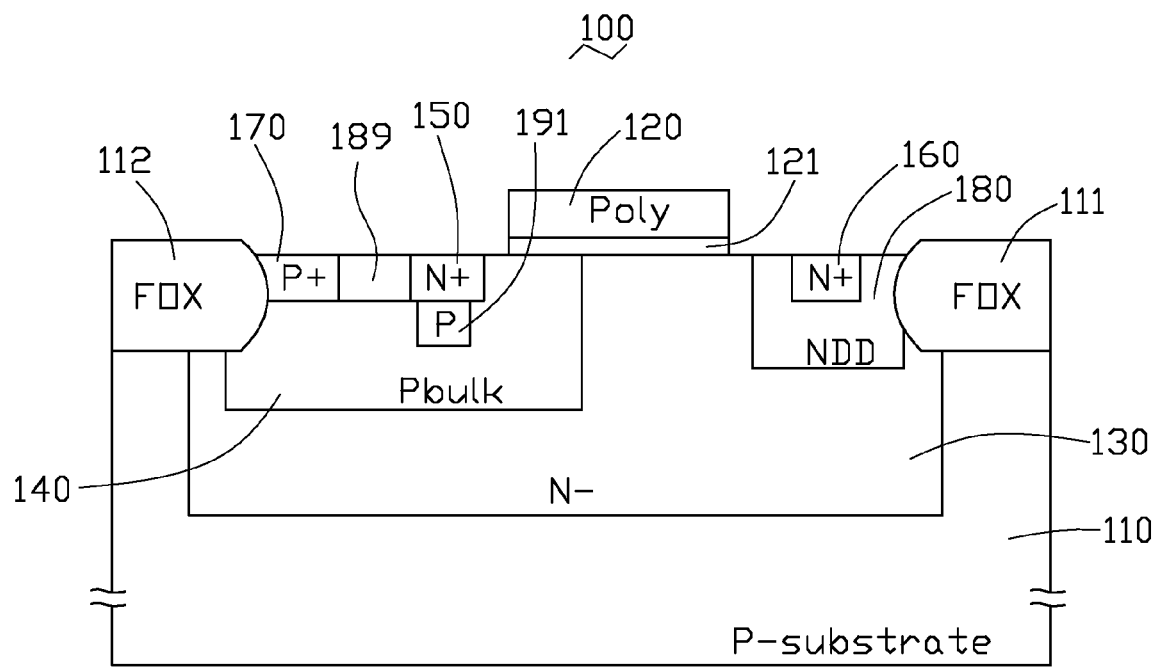
FIG. 1 is a schematic cross sectional view of a LDMOS device in accordance with a first exemplary embodiment.

Referring to FIG. 1, a lateral diffused metal oxide semiconductor (LDMOS) device 100 includes a P-type substrate 110, a gate oxide film 121 located on the P-type substrate 110, a poly gate 120 located on the gate oxide film 121, an N-type slightly doped region 130 formed in the P-type substrate 110, two P-type highly doped regions 140, 170, two N-type highly doped regions 150, 160, an N-type doped region 180, a P-type doped region 191, a first field oxide region 111, and a second field oxide region 112.

The P-type highly doped regions 140 and the N-type doped region 180 are formed in the N-type slightly doped region 130. The N-type highly doped region 160 is formed in the N-type doped region 180. The N-type highly doped region 150, the P-type highly doped region 170, and the P-type doped region 191 are formed in the P-type highly doped regions 140. The N-type highly doped regions 150, 160 are located at two sides of the poly gate 120, correspondingly, and disposed in a layer of the P-type substrate 110. Thus, the N-type highly doped regions 150, 160 can be formed by using only one layout layer. As a result, steps for manufacturing the LDMOS device 100 can be omitted and manufacturing costs can be slashed/reduced. The P-type highly doped region 170 is adjacent to the N-type highly doped region 150. The P-type doped region 191 is beneath the N-type highly doped region 150. Parts of the N-type slightly doped region 130 and the P-type highly doped region 140 are beneath the poly gate 120 to isolate the N-type highly doped region 150 from the N-type highly doped region 160. The first field oxide region 111 is located adjacent to the N-type highly doped region 160 for isolating the N-type highly doped region 160 from a P-type highly doped region and an N-type highly doped region (acting as a source) of another LDMOS device. The second field oxide region 112 is located adjacent to the P-type highly doped region 170 and the N-type highly doped region 150. The second field oxide region 112 is configured for isolating the P-type highly doped region 170 and the N-type highly doped region 150 from an N-type highly doped region (acting as a drain) of another LDMOS device.

An impurity concentration of the P-type highly doped region 140 is lower than the impurity concentrations of the P-type highly doped region 170 and P-type doped region 191. An impurity concentration of the N-type doped region 180 is higher than that of the N-type slightly doped region 130, and lower than that of the N-type highly doped region 160.

The N-type slightly doped region 130 acts as an N-well. The P-type highly doped regions 140 acts as a P-body. When operated, the N-type highly doped region 150 acts as a source, provides an ohmic contact with a source electrode (not shown), and receives a source voltage from the source electrode. The poly gate 120 provides an ohmic contact with a gate electrode, and receives a gate voltage from the gate electrode. The N-type highly doped region 160 acts as a drain, provides an ohmic contact with a drain electrode, and receives a drain voltage from the drain electrode. The P-type highly doped region 170 provides an ohmic contact with a bulk electrode (not shown), and receives a bulk voltage from the bulk electrode.

As an embodiment, the P-type highly doped region 170 contacts the N-type highly doped region 150. Therefore, the bulk voltage applied to the P-type highly doped region 170 equals to the source voltage applied to the N-type highly doped region 150. As another embodiment, the P-type highly doped region 170 is not in contact with the N-type highly doped region 150. A dielectric oxide 189 may be filled in a clearance between the P-type highly doped region 170 and the N-type highly doped region 150. Under this condition, the bulk voltage applied to the P-type highly doped region 170 may be different from the source voltage applied to the N-type highly doped region 150.

When the LDMOS device 100 is in a normal state and a voltage is applied to the poly gate 120, part of the P-type highly doped regions 140 (the P-body) under the poly gate 120 inverses. Thus, a channel is formed from the N-type highly doped region 150 (the source) to the N-type slightly doped region 130 (the N-well). When a source voltage is applied to the source and a drain voltage is applied to the N-type highly doped region 160 (the drain), electrons in the source pass through the channel, then flows through the N-well 130 and N-type doped region 180, and finally to the drain.

When the LDMOS device 100 is under an electrostatic discharge (ESD) state, for example, when the drain electrode (not shown) attached to the drain of the LDMOS device 100 is touched by a person, a high electrostatic voltage (2 KV, for example) zaps on the drain electrode, while the source electrode, the gate electrode, and the bulk electrode (not shown) attached to the LDMOS device 100 are relative grounded. That is, the high electrostatic voltage is applied to the N-type highly doped region 160, while the poly gate 120, the N-type highly doped region 150, and the P-type highly doped region 170 are grounded. The P-N junction between the N-type slightly doped region 130 and the P-type highly doped region 140 breakdowns first to discharge the electrostatic voltage. Therefore ESD current flows to ground through the N-type highly doped region 150. Meanwhile, the N-type slightly doped region 130, the P-type highly doped region 140, the P-type doped region 191, and the N-type highly doped region 150 forms a vertical NPN bipolar junction transistor (BJT) that turns on to bypass the ESD current. The N-type slightly doped region 130, the P-type highly doped region 140, and the N-type highly doped region 150 forms a horizontal NPN BJT that turns on to bypass the ESD current. Because the P-type doped region 191 is located beneath the N-type highly doped region 150, and the impurity concentration of the P-type doped region 191 is higher than that of the P-type highly doped region 140, the P-type doped region 191 affects the current-voltage (I-V) characteristic of the LDMOS device 100 under ESD condition. The I-V characteristic includes a breakdown voltage, a snapback voltage, a holding current, and a second breakdown current. As a result, the I-V characteristic of the LDMOS device 100 can be optimized by adjusting the location and the impurity concentration of the P-type doped region 191. Accordingly, the ESD robustness of the LDMOS device 100 is improved and is better than conventional LDMOS devices.

Figure 2:
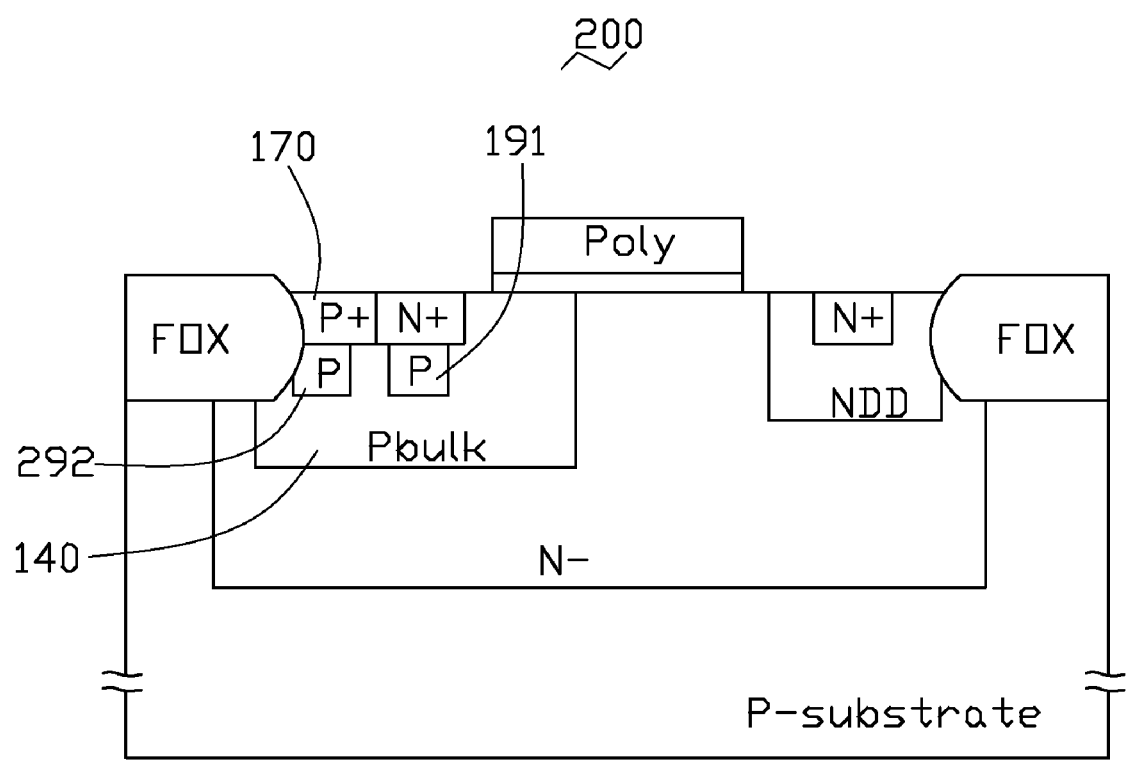
FIG. 2 is a schematic cross sectional view of a LDMOS device in accordance with a second exemplary embodiment.

FIG. 2 is a schematic cross sectional view of a LDMOS device 200 in accordance with a second exemplary embodiment. The LDMOS device 200 is similar to the LDMOS device 100. When compared with the LDMOS device 100, the LDMOS device 200 further includes a P-type doped region 292 beneath the P-type highly doped region 170. The P-type doped region 292 is adjacent to, but not in contact with the P-type doped region 191. A clearance is defined/formed between the P-type doped region 292 and the P-type doped region 191. A transverse length of the P-type doped region 292 is shorter than that of the P-type highly doped region 170, so that the P-type highly doped region 170 can contact the P-type highly doped region 140 directly.

An impurity concentration of the P-type doped region 292 is higher than that of the P-type highly doped region 140. In the exemplary embodiment, the impurity concentration of the P-type doped region 292 is also lower than that of the P-type highly doped region 170.

The P-type doped region 191 and the P-type doped region 292 are disposed in a layer of the LDMOS device 200. Thus, they can be formed by using only one layout layer. Therefore, steps for manufacturing the LDMOS device 200 can be omitted and manufacturing costs can be slashed/reduced.

Figure 3:
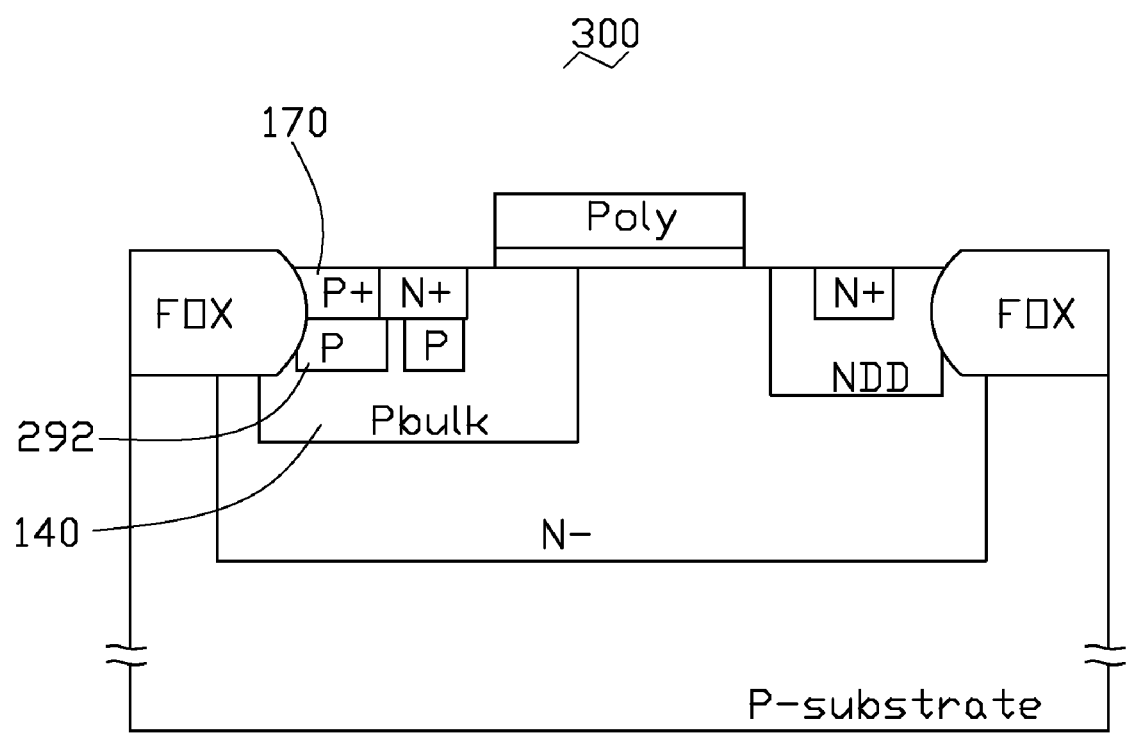
FIG. 3 is a schematic cross sectional view of a LDMOS device in accordance with a third exemplary embodiment.

FIG. 3 is a schematic cross sectional view of a LDMOS device 300 in accordance with a third exemplary embodiment. When compared with the LDMOS device 200, the transverse length of the P-type doped region 292 in the LDMOS device 300 is longer than that of the P-type highly doped region 170 so as to keep the P-type highly doped region 170 separated from the P-type highly doped region 140.

Figure 4:
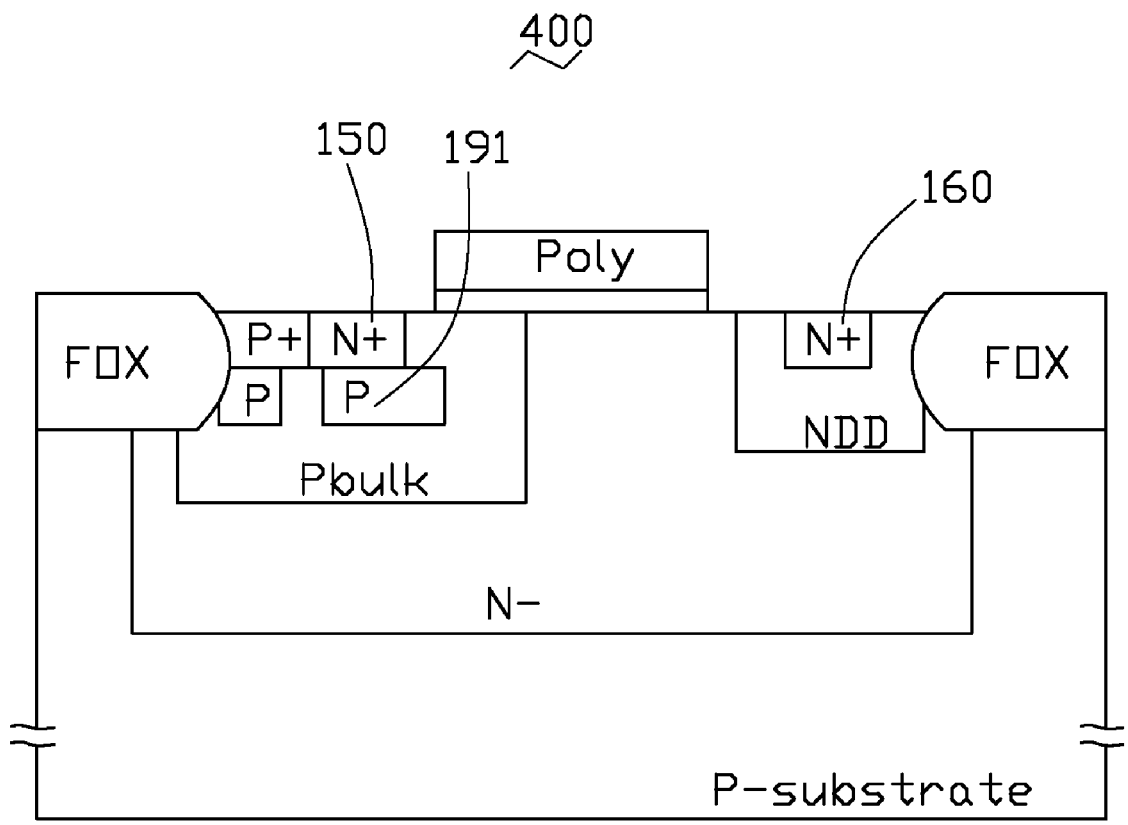
FIG. 4 is a schematic cross sectional view of a LDMOS device in accordance with a fourth exemplary embodiment.

FIG. 4 is a schematic cross sectional view of a LDMOS device 400 in accordance with a fourth exemplary embodiment. When compared with the LDMOS device 200, the P-type doped region 191 extends towards/along a direction to/of the N-type highly doped region 160 so as to cover a bottom edge of the N-type highly doped region 150.

Figure 5:
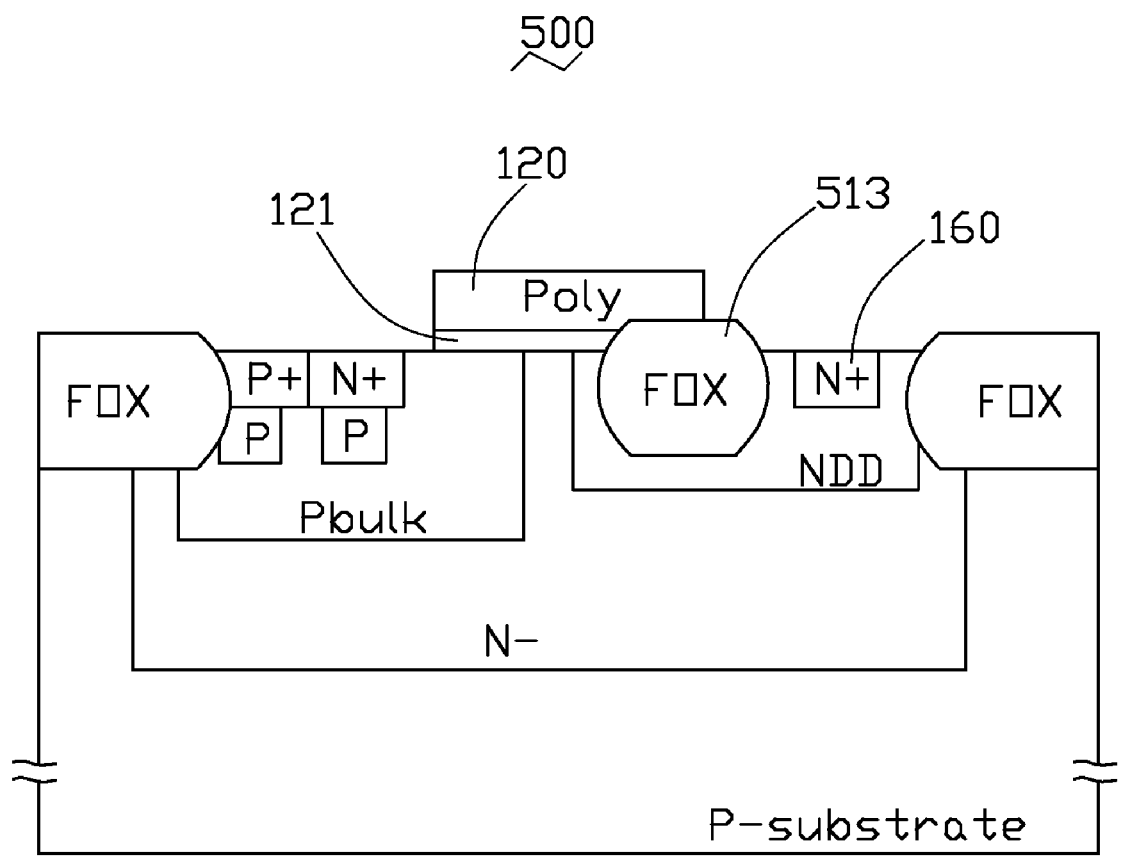
FIG. 5 is a schematic cross sectional view of a LDMOS device in accordance with a fifth exemplary embodiment.

FIG. 5 is a schematic cross sectional view of a LDMOS device 500 in accordance with a fifth exemplary embodiment. When compared with the LDMOS device 200, the LDMOS device 500 further includes a third field oxide region 513 disposed between the poly gate 120 and the N-type highly doped region 160. The third field oxide region 513 is configured for reducing a vertical electrical field across the gate oxide film 121.

For the same reason mentioned above, the third field oxide region 513 can be disposed in the LDMOS devices 100, 300, and 400 to reduce a vertical electrical field across the gate oxide film 121.

In other embodiments, the P-type materials can be replaced by N-type materials, while the N-type materials are replaced by P-type materials.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A lateral diffused metal oxide semiconductor device, comprising:
    a first-type substrate;
    a gate oxide film disposed on the first-type substrate;
    a poly gate disposed on the gate oxide film;
    a first second-type slightly doped region formed in the first-type substrate and acting as a well;
    a first first-type highly doped region formed in the well and acting as a body;
    a first second-type highly doped region formed in the body and acting as a source;
    a second second-type highly doped region formed in the well and acting as a drain;
    a second first-type highly doped region formed in the body; and a first first-type doped region formed in the body and is beneath the source;

wherein the source and the drain are disposed at two sides of the poly gate, the second first-type highly doped region is adjacent to the source, parts of the body and the well are directly beneath the poly gate to isolate the source from the drain, the first first-type doped region is independent from the second first-type highly doped region, the lateral diffused metal oxide semiconductor device further comprising a second first-type doped region formed in the body, beneath the second first-type highly doped region, and a clearance is defined between the second first-type doped region and the first first-type doped region.

2. The lateral diffused metal oxide semiconductor device as described in claim 1, wherein a transverse length of the second first-type doped region is shorter than a transverse length of the second first-type highly doped region, the second first-type highly doped region and the body directly contact with each other.

3. The lateral diffused metal oxide semiconductor device as described in claim 1, wherein a transverse length of the second first-type doped region is longer than a transverse length of the second first-type highly doped region to keep the second first-type highly doped region separated from the body.

4. The lateral diffused metal oxide semiconductor device as described in claim 1, wherein the first first-type doped region extends towards the drain to cover a bottom edge of the first first-type doped region.

5. The lateral diffused metal oxide semiconductor device as described in claim 1, wherein an impurity concentration of the first first-type doped region is higher than an impurity concentration of the body.

6. The lateral diffused metal oxide semiconductor device as described in claim 1, wherein an impurity concentration of the second first-type doped region is higher than an impurity concentration of the body.

7. The lateral diffused metal oxide semiconductor device as described in claim 6, wherein the impurity concentration of the second first-type doped region is lower than an impurity concentration of the second first-type highly doped region.

8. The lateral diffused metal oxide semiconductor device as described in claim 1, further comprising a second-type doped region formed in the well and surrounding the drain.

9. The lateral diffused metal oxide semiconductor device as described in claim 8, wherein an impurity concentration of the second-type doped region is higher than an impurity concentration of the well.

10. The lateral diffused metal oxide semiconductor device as claimed in claim 1, further comprising a first field oxide adjacent to the drain, the first field oxide isolates the drain from a second first-type highly doped region and a source of another lateral diffused metal oxide semiconductor device.

11. The lateral diffused metal oxide semiconductor device as claimed in claim 1, further comprising a second field oxide adjacent to the source and the second first-type highly doped region, the second field oxide isolates the source and the second first-type highly doped region from a drain of another lateral diffused metal oxide semiconductor device.

12. The lateral diffused metal oxide semiconductor device as described in claim 1, further comprising a third field oxide disposed between the poly gate and the drain to weaken an intensity of a vertical electric field vertically across the gate oxide film.

13. The lateral diffused metal oxide semiconductor device as described in claim 1, wherein the second first-type highly doped region contacts to the source.

14. The lateral diffused metal oxide semiconductor device as described in claim 1, wherein a clearance is defined between the second first-type highly doped region and the source.

15. The lateral diffused metal oxide semiconductor device as described in claim 14, further comprising a field oxide for isolating the second first-type highly doped region to the source.

16. The lateral diffused metal oxide semiconductor device as described in claim 1, wherein the first-type is a P-type, and the second-type is an N-type.

17. The lateral diffused metal oxide semiconductor device as described in claim 1, wherein the first-type is an N-type, and the second-type is a P-type.

* * * * *